United States Patent
Suzuki et al.

(10) Patent No.: US 10,251,295 B2
(45) Date of Patent: Apr. 2, 2019

(54) ELECTRONIC DEVICE AND METHOD OF PRODUCING THE SAME

(71) Applicant: ALPS ALPINE CO., LTD., Tokyo (JP)

(72) Inventors: Ryosuke Suzuki, Miyagi-ken (JP); Keisuke Nakayama, Miyagi-ken (JP); Satoshi Waga, Miyagi-ken (JP); Yuji Kodama, Miyagi-ken (JP); Hisanao Takahara, Miyagi-ken (JP)

(73) Assignee: ALPS ALPINE CO., LTD., Tokyo (JP)

( * ) Notice: Subject to any disclaimer, the term of this patent is extended or adjusted under 35 U.S.C. 154(b) by 0 days.

(21) Appl. No.: 15/415,578

(22) Filed: Jan. 25, 2017

(65) Prior Publication Data

US 2017/0223855 A1   Aug. 3, 2017

(30) Foreign Application Priority Data

Feb. 1, 2016   (JP) ................................ 2016-017007
Nov. 14, 2016  (JP) ................................ 2016-221160

(51) Int. Cl.
*H05K 7/00* (2006.01)
*H05K 7/12* (2006.01)
*G01D 11/24* (2006.01)

(52) U.S. Cl.
CPC ............. *H05K 7/12* (2013.01); *G01D 11/245* (2013.01)

(58) Field of Classification Search
None
See application file for complete search history.

(56) References Cited

U.S. PATENT DOCUMENTS

| | | | | |
|---|---|---|---|---|
| 7,042,212 | B2 * | 5/2006 | Yoshikawa | G01D 5/145 324/207.25 |
| 8,100,010 | B2 * | 1/2012 | Fly | G01C 19/5719 73/493 |
| 2010/0109654 | A1 * | 5/2010 | Schneider | G01D 5/20 324/207.2 |
| 2012/0032670 | A1 * | 2/2012 | Ikeda | F02D 9/105 324/207.25 |
| 2014/0103913 | A1 | 1/2014 | Chrismann | |
| 2014/0345994 | A1 | 11/2014 | Varela et al. | |

FOREIGN PATENT DOCUMENTS

WO   WO 2014/093763 A1   6/2014

* cited by examiner

*Primary Examiner* — Courtney Smith
*Assistant Examiner* — Rashen E Morrison
(74) *Attorney, Agent, or Firm* — Brinks Gilson & Lione

(57) ABSTRACT

A first main body portion and a second main body portion of an electronic package are mounted on a mount portion of a support body, first metal projections are caused to enter first receiving recesses, and second metal projections are caused to enter second receiving recesses. When a clip member is mounted in the a first direction, the first metal projections are pressed by first pressing portions of the clip member, the second metal projections are pressed by second pressing portions of the clip member, and an elastic piece is pressed against a rear side of the support body. Thus, the electronic package is secured.

15 Claims, 8 Drawing Sheets

ELECTRONIC DEVICE AND METHOD OF PRODUCING THE SAME

CLAIM OF PRIORITY

This application claims benefit of priority to Japanese Patent Application No. 2016-017007 filed on Feb. 1, 2016, and Japanese Patent Application No. 2016-221160, filed on Nov. 14, 2016, which are hereby incorporated by reference in their entireties.

BACKGROUND

1. Field of the Disclosure

The present disclosure relates to an electronic device in which an electronic package such as a sensor package is secured to a support body serving as part of a hermitically sealed housing and relates to a method of producing the electronic device.

2. Description of the Related Art a device relating to a position detecting sensor is described in Japanese Unexamined Patent Application Publication No. 5-34102. This position detecting sensor detects a stroke position of a piston in a fluid pressure cylinder.

The inside of this position detecting sensor is tightly closed by a cap mounted on an opening of a main body casing with an O-ring interposed therebetween. A board is housed in the main body casing. A reed switch serving as a magnetic sensor, a light emitting diode connected in series with the reed switch, and a diode connected in parallel with the light emitting diode are mounted on the board. Light emitted by the light emitting diode illuminates an indicator window provided in the main body casing.

However, in the position detecting sensor described in Japanese Unexamined Patent Application Publication No. 5-34102, the reed switch serving as the magnetic sensor is mounted on the board by soldering. However, mounting by soldering increases work time corresponding to man-hours for soldering work, thereby increasing the production cost. Furthermore, in the case where the position detecting sensor is used for a fluid pressure cylinder of an internal combustion engine, the position detecting sensor is used in a high-temperature environment. Accordingly, it is not preferred to secure the reed switch onto the board by soldering.

Furthermore, although it is not explicitly described in Japanese Unexamined Patent Application Publication No. 5-34102, in order to firmly secure a main body of the magnetic sensor onto the board or the like, a configuration in which the magnetic sensor is fixed onto the board by a resin material is adopted. In this case, however, a step of applying the resin material and a step of curing the resin by heating are required. This increases the work time, and accordingly, increases the production cost. Furthermore, when circuitry is included in the magnetic sensor, detection errors may become larger due application of stress from the resin material to the main body of the magnetic sensor.

The present invention provides an electronic device in which an electronic package such as a sensor package can be secured to a support body by simple work and a method of producing this electronic device.

SUMMARY

An electronic device includes an electronic package and a support body that supports the electronic package. A main body having side surfaces that face each other and metal projections that project from the respective side surfaces are provided in the electronic package. A mount portion on which the main body is mounted and projection receiving portions that receive the respective metal projections are disposed in the support body. The metal projections and the support body are clamped by a clip member that comprises an elastic metal plate.

Next, a method of producing an electronic device is disclosed in which an electronic package is secured to a support body. The method includes the steps of providing in the electronic package a main body having side surfaces facing each other and metal projections that project from the respective side surfaces of the main body, forming in the support body a mount portion on which the main body is mounted and projection receiving portions that receive the respective metal projections, forming a pressing portion and an elastic piece located on sides that face each other in a clip member formed of an elastic metal plate, mounting the clip member to the support body in a direction perpendicular to a direction in which the pressing portion and the elastic piece face each other, and elastically pressing the elastic piece against a rear side of the support body so as to cause the pressing portion to press the metal projections against the projection receiving portions.

DESCRIPTION OF THE EXEMPLARY EMBODIMENTS

First Embodiment

Figure 1:
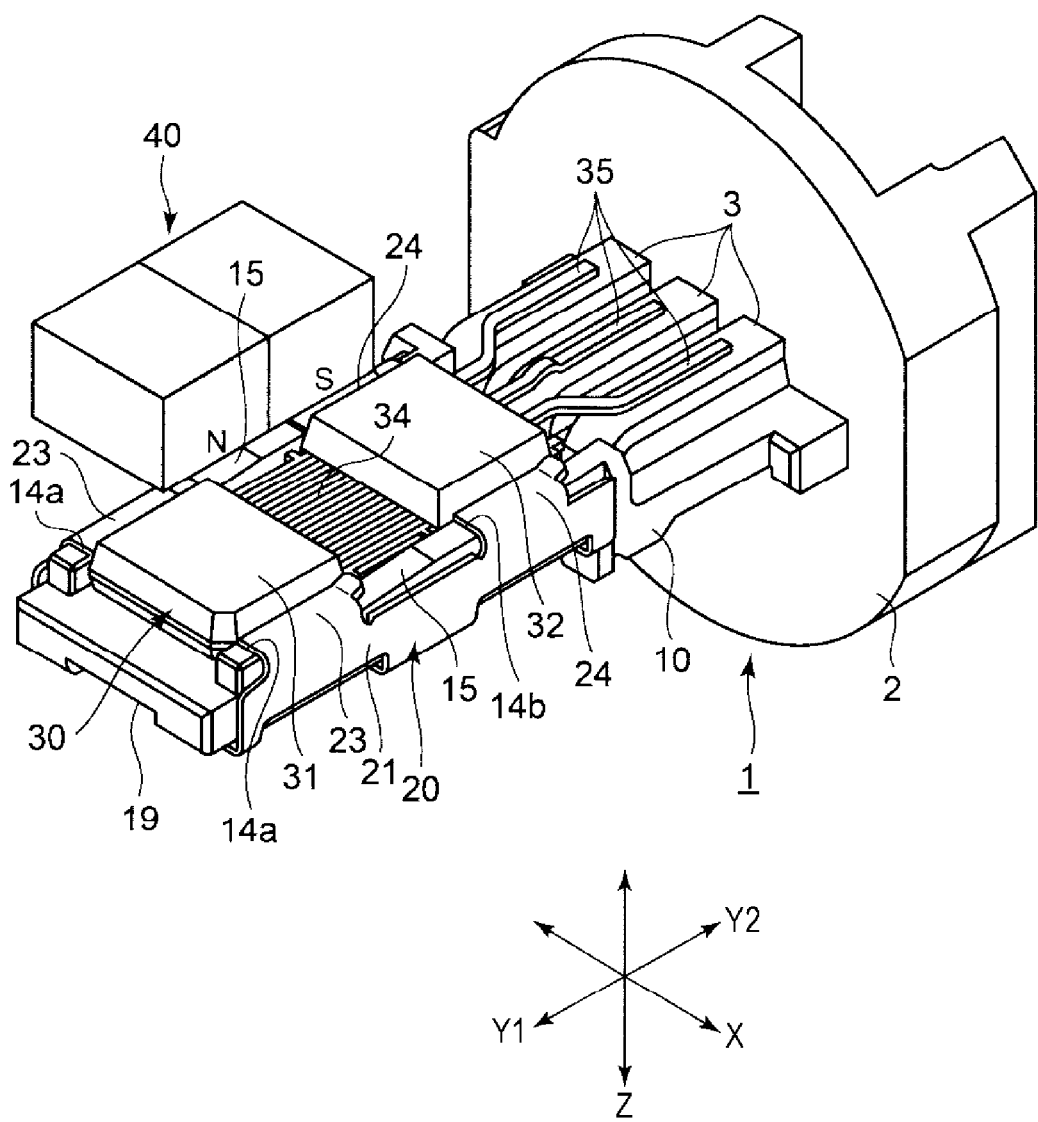
FIG. 1 is a perspective view of an electronic device according to a first embodiment of the present invention.

As illustrated in FIG. 1, an electronic device 1 according to a first embodiment of the present invention includes a base portion 2 formed of synthetic resin. A support body 10 extending in the Y1 direction is integrally formed with the base portion 2. An electronic package 30 is provided on the support body 10. The support body 10 and the electronic package 30 are clamped by a clip member 20 so as to be secured.

Although it is not illustrated, a cylindrical casing is mounted on the Y1 side of the base portion 2 of the electronic device 1 with packing attached between the base portion 2 and the casing, thereby shielding the support body 10, the electronic package 30, and the clip member 20 positioned inside the casing from outside air.

According to the first embodiment, the electronic device 1 is a sensor device and the electronic package 30 is a sensor package. The sensor package is an integrated circuit (IC)

package in which a magnetic sensitive element such as a Hall element and detection circuitry associated to the magnetic sensitive element are encapsulated.

The electronic device 1 is used to, for example, detect the opening degree of a valve in an intake system of an internal combustion engine. In this case, a magnet 40 is provided outside the casing (not illustrated) of the electronic device 1. The magnet 40 rotates as the valve is opened and closed. The rotational angle of the magnet 40 is detected by the electronic package 30 serving as the sensor package.

The electronic package 30 may house another type of sensor packages such as a pressure sensor or a humidity sensor. Alternatively, the electronic package 30 may be a switch package that houses a magnetic switch or the like.

Figure 2:
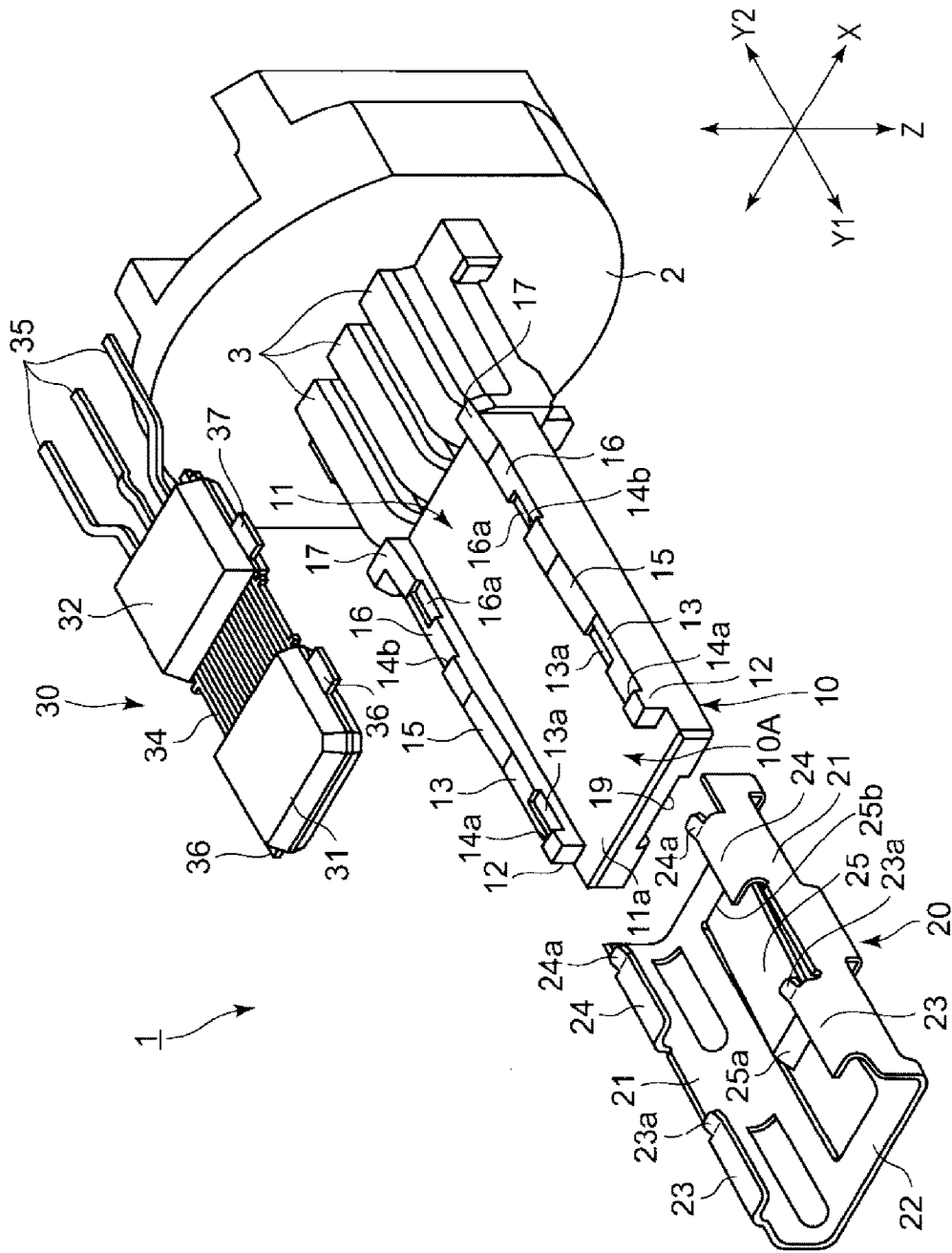
FIG. 2 is an exploded perspective view of the electronic device of FIG. 1.

As illustrated in FIG. 2, the size of the support body 10 is larger in the Y direction, which is the longitudinal direction than in the X direction which is the width direction.

As illustrated in FIG. 2, a mount portion 11 is formed in a central portion in the X direction on a front side 10A of the support body 10. The mount portion 11 is a recess extending in the Y direction. Rise portions 12 that rise in the Z direction and continue in the Y direction are formed on both sides in the X direction of the mount portion 11.

First projection receiving portions 13 are formed on the rise portions 12 on a distal side (Y1 side) of the support body 10. The first projection receiving portions 13 are parallel to a bottom surface 11a of the mount portion 11 and, preferably, have receiving recesses 13a formed therein. The receiving recesses 13a are recessed from the first projection receiving portions 13 and open toward the mount portion 11.

Preferably, a first regulating step portions 14a that rise in the Z direction are formed so as to be located further to the distal side (Y1 side) of the support body 10 than the first projection receiving portions 13. Inclined surfaces 15 are formed on upper surfaces of the rise portions 12. The inclined surfaces 15 are continuous with the first projection receiving portions 13 and inclined upward toward the base portion 2 side (Y2 side). The rise portions 12 have second projection receiving portions 16 formed on upper surfaces thereof on the base portion 2 side (Y2 side). The second projection receiving portions 16 are parallel to the bottom surface 11a of the mount portion 11. Preferably, the second projection receiving portions 16 have receiving recesses 16a formed therein. The receiving recesses 16a are recessed from the second projection receiving portions 16 and open toward the mount portion 11.

Preferably, a second regulating step portions 14b that rise in the Z direction are formed at positions closer to the distal side (Y1 side) of the support body 10 than the second projection receiving portions 16. Inclined surfaces 17 are formed on the upper surfaces of the rise portions 12. The inclined surfaces 17 are continuous with the second projection receiving portions 16 and rises in the base portion 2 direction (Y2 direction).

Figure 3:
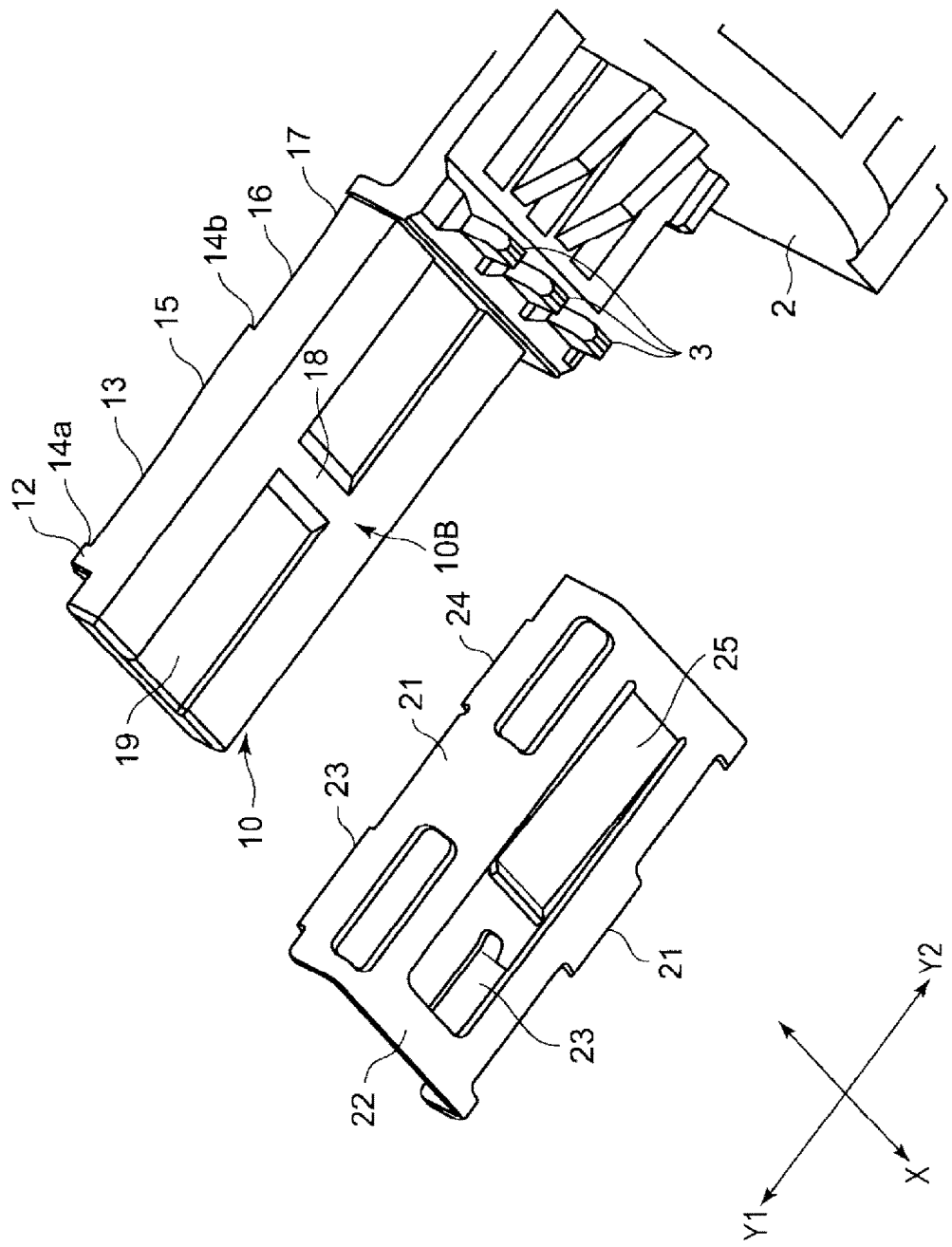
FIG. 3 is an exploded perspective view of the electronic device of FIG. 1 seen from the back side.

As illustrated in FIG. 3, an abutment portion 18 is formed in a substantially central portion in the longitudinal direction (Y direction) on a rear side 10B of the support body 10. Also, a groove 19 is preferably formed so as to be located further to the distal side (Y1 side) of the support body 10 than the abutment portion 18. The groove 19 is open in the Y1 direction. Preferably, the groove 19 is recessed more than the abutment portion 18.

The clip member 20 is formed of an electrically conductive plate spring material such as a phosphor bronze plate. As illustrated in FIGS. 2 and 3, the clip member 20 includes side walls 21 and, preferably, a connecting portion 22. The side walls 21 are provided on both side portions in the X direction so as to face each other. The connecting portion 22 connects the side walls 21 to each other.

Preferably, first pressing portions 23 are formed on the Y1 sides of upper end portions of the side walls 21 of the clip member 20. Preferably, second pressing portions 24 are formed on the Y2 sides of the upper end portions of the side walls 21 of the clip member 20. A pair of the first pressing portions 23 face the connecting portion 22 in the Z direction, and upwardly bent guide pieces 23a are formed on the Y2 sides of the first pressing portions 23. Likewise, a pair of the second pressing portions 24 face the connecting portion 22 in the Z direction, and upwardly bent guide pieces 24a are formed on the Y2 sides of the second pressing portions 24.

Preferably, an elastic piece 25 is integrally formed with the clip member 20 at a bottom portion of the clip member 20. A distal end portion 25a of the elastic piece 25 faces in the Y1 direction. The elastic piece 25 is bent upward from a proximal portion 25b.

Figure 4:
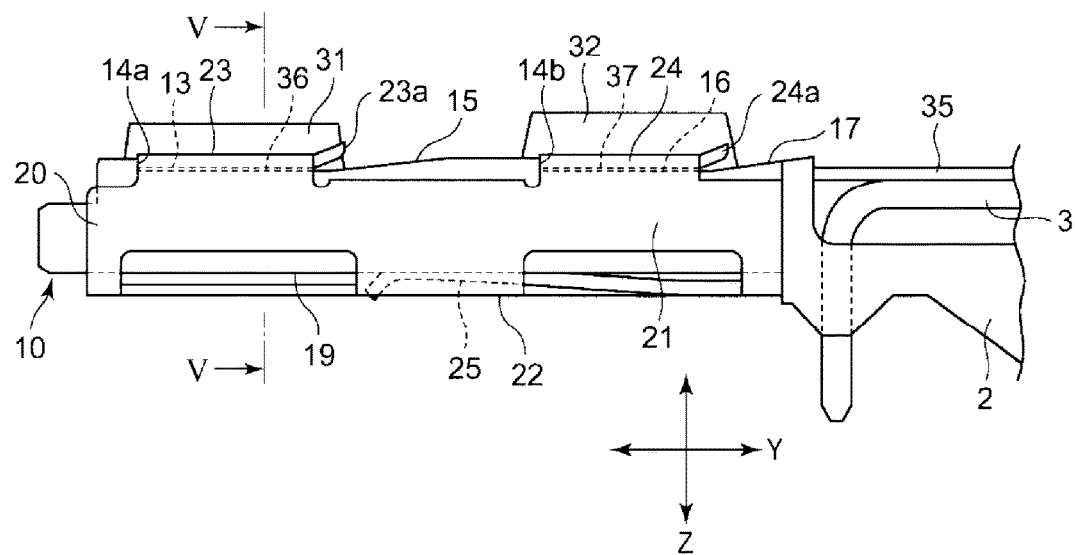
FIG. 4 is a side view of the electronic device of FIG. 1.

As illustrated in FIGS. 2, 3, and 4, connecting members 3 are attached to the base portion 2 side (Y2 side) of the support body 10. The connecting members 3 are each bent into an L-shape and, as illustrated in FIG. 2, embedded in a proximal part on the base portion 2 side of the support body 10.

Preferably, as illustrated in FIGS. 1 and 2, the electronic package 30 includes a first main body portion 31 and a second main body portion 32. The first main body portion 31 includes a molded body formed of resin. The Hall element serving as a magnetic sensor and a circuit unit are housed in the molded body. Preferably, a plurality of electrically conductive terminals 34 are provided. The electrically conductive terminals 34 that extend in the Y2 direction from the circuit unit in the first main body portion 31 pass through the inside of the second main body portion 32. Capacitors for preventing electrostatic destruction are housed in the second main body portion 32. The capacitors are coupled between the adjacent electrically conductive terminals 34. Connecting terminals 35 extend from the second main body portion 32 toward the Y2 side. The electrically conductive terminals 34 are made by cutting an electrically conductive metal plate into pieces. Some of the cut pieces serve as both the electrically conductive terminals 34 and the connecting terminals 35.

First metal projections 36 preferably project from both side portions of the first main body portion 31 that face in the X direction, and second metal projections 37 preferably project from both side portions of the second main body portion 32 that face in the X direction. The first metal projections 36 and the second metal projections 37 are integrally formed with the corresponding electrically conductive terminals 34 located in the first main body portion 31 and the second main body portion 32. The first metal projections 36 and the second metal projections 37 are preferably set to, for example, a ground potential.

Next, a method of assembling (method of producing) the electronic device 1 is described.

The first main body portion 31 and the second main body portion 32 of the electronic package 30 are mounted on the recessed mount portion 11 of the support body 10. At this time, the first metal projections 36 projecting from the first main body portion 31 are preferably caused to enter the receiving recesses 13a formed in the first projection receiving portions 13 of the support body 10, and the second metal projections 37 projecting from the second main body portion 32 are preferably caused to enter the receiving recesses 16a formed in the second projection receiving portions 16 of the support body 10.

Figure 5:
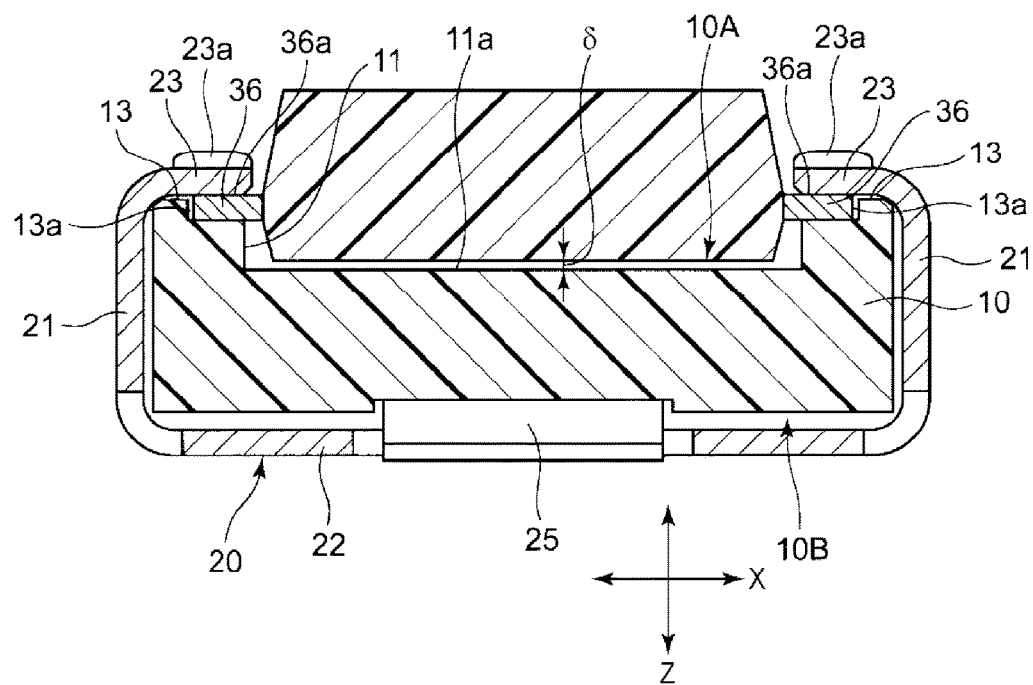
FIG. 5 is a sectional view of the electronic device of FIG. 4 taken along line V-V.

When the first metal projections 36 projecting from both the sides in the X direction enter the receiving recesses 13a and the second metal projections 37 projecting from both the sides in the X direction similarly to the first metal projections 36 enter the receiving recesses 16a, the electronic package 30 is positioned so that the electronic package 30 is not largely moved in the X or Y direction on the support body 10. Furthermore, as illustrated in FIG. 5, upper surfaces 36a of the first metal projections 36 disposed in the receiving recesses 13a slightly project upward in the Z direction from the first projection receiving portions 13. Likewise, upper surfaces of the second metal projections 37 slightly project upward in the Z direction from the second projection receiving portions 16.

Next, the clip member 20 is mounted. The clip member 20 is mounted in the Y2 direction and removed in the Y1 direction.

After the electronic package 30 has been mounted on the support body 10, the clip member 20 is mounted in the Y2 direction. Preferably, the clip member 20 is mounted in the Y2 direction such that the connecting portion 22 faces the rear side 10B of the support body 10 and the first pressing portions 23 and the second pressing portions 24 face the front side 10A of the support body 10. At this time, the second pressing portions 24 are moved on the first regulating step portions 14a, the first projection receiving portions 13, and the inclined surfaces 15 in the Y2 direction, and after that, the first pressing portions 23 are moved on the first regulating step portions 14a in the Y2 direction.

As illustrated in FIG. 3, the groove 19 open toward the Y1 side is formed on the rear side 10B of the support body 10. Thus, the elastic piece 25 provided in the connecting portion 22 of the clip member 20 preferably passes through the groove 19 for a while from the start of the mounting work of the clip member 20. This prevents the elastic piece 25 from being strongly elastically pressed against the rear side 10B of the support body 10, thereby reducing resistance during the mounting of the clip member 20 in the Y2 direction.

When the clip member 20 is further moved in the Y2 direction, the second pressing portions 24 of the clip member 20 pass on the second regulating step portions 14b, and the first pressing portions 23 of the clip member 20 pass on the first regulating step portions 14a. As a result, as illustrated in FIGS. 1 and 4, the first pressing portions 23 are moved to positions where the first pressing portions 23 can press the first metal projections 36 from above, and the second pressing portions 24 are moved to positions where the second pressing portions 24 can press the second metal projections 37 from above. At this time, the elastic piece 25 that has so far been passing through the groove 19 on the rear side 10B of the support body 10 is preferably moved onto the abutment portion 18 and elastically pressed against the rear side 10B of the support body 10. Also at this time, preferably, the first pressing portions 23 press the first metal projections 36 in the receiving recesses 13a against the first projection receiving portions 13 and the second pressing portions 24 press the second metal projections 37 in the receiving recesses 16a against the second projection receiving portions 16.

When the first metal projections 36 and the second metal projections 37 are positioned and clamped on the upper surfaces of the rise portions 12 of the support body 10, as illustrated in FIG. 5, a gap δ is preferably formed between the bottom surface 11a of the mount portion 11 of the support body 10 and lower surfaces of the first main body portion 31 and the second main body portion 32. In this case, the electronic package 30 is secured to the support body 10 only at the first metal projections 36 and the second metal projections 37. This allows the first main body portion 31 and the second main body portion 32 to be stably held on the mount portion 11 without being subjected to external forces.

Since forces such as a compressive force do not directly act on the first main body portion 31, a situation in which large stress acts on the circuitry in the first main body portion 31 can be avoided, and accordingly, problems such as variation in detection value due to the stress acting on the circuit can be prevented. Furthermore, since soldering is not used, mounting work of the electronic package 30 is easy, and the electronic device 1 is likely to last in use even in a high-temperature environment.

Preferably, as illustrated in FIGS. 1 and 4, when the clip member 20 is mounted, the first pressing portions 23 are hooked on the first regulating step portions 14a of the support body 10 and the second pressing portions 24 are hooked on the second regulating step portions 14b. This prevents the clip member 20 from being removed in the Y1 direction.

As illustrated in FIG. 1, when the electronic package 30 is mounted on the support body 10, the connecting terminals 35 of the electronic package 30 are disposed on the connecting members 3 provided in the proximal part on the base portion 2 side of the support body 10, and the connecting terminals 35 and the connecting members 3 are connected to one another by spot welding or soldering.

The electronic package 30 can be stably mounted on the support body 10 by mounting the clip member 20 in the Y2 direction. Thus, the assembly of the electronic device 1 can be reliably performed within a short period of time. Furthermore, no excessive force acts on the first main body portion 31 of the electronic package 30.

Furthermore, as illustrated in FIG. 1, the side walls 21 of the clip member 20 face both the side portions of the electronic package 30 in the X direction, and the connecting portion 22 of the clip member 20 faces a bottom portion of the electronic package 30. Thus, by setting the first metal projections 36 and the second metal projections 37 of the electronic package 30 to a constant potential such as, preferably, the ground potential, the clip member 20 can function as a shield member that protects the electronic package 30.

Second Embodiment

Figure 6:
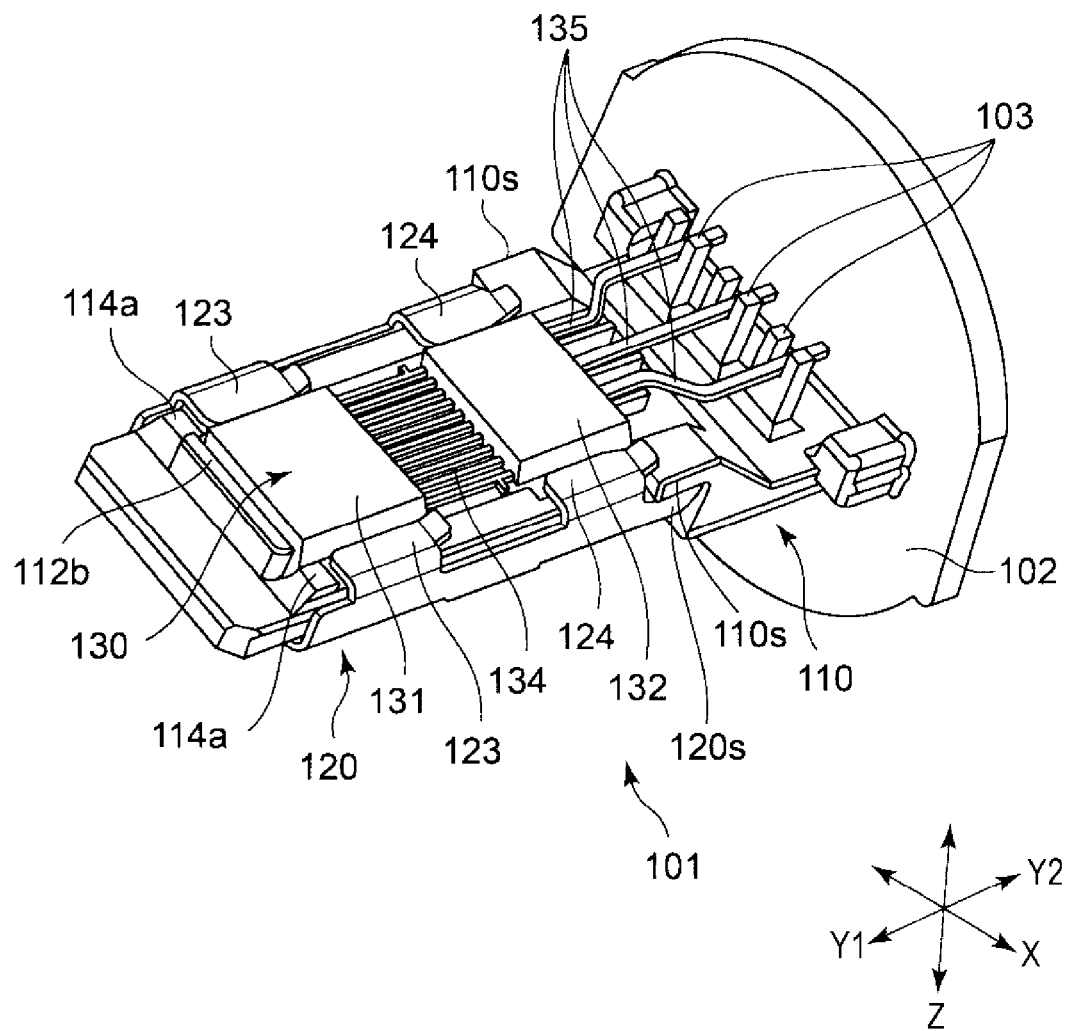
FIG. 6 is a perspective view of an electronic device according to a second embodiment of the present invention.

As illustrated in FIG. 6, as is the case with the electronic device 1 according to the first embodiment, an electronic device 101 according to a second embodiment of the present invention includes a base portion 102 formed of synthetic resin. A support body 110 extending in the Y1 direction is integrally formed with the base portion 102. An electronic package 130 is provided on the support body 110. The support body 110 and the electronic package 130 are clamped by a clip member 120 so as to be secured. As is the case with the electronic device 1 according to the first embodiment, a cylindrical casing (not illustrated) is mounted on the Y1 side of the base portion 102 of the electronic device 101, thereby shielding the support body 110, the electronic package 130, and the clip member 120 positioned inside the casing from outside air.

As is the case with the electronic device 1 according to the first embodiment, the electronic device 101 is a sensor device and the electronic package 130 is a sensor package. The electronic device 101 is used to, for example, detect the opening degree of a valve in an intake system of an internal combustion engine. As is the case with the magnet 40 according to the first embodiment, a magnet (not illustrated) is provided outside the casing (not illustrated) of the electronic device 101. The magnet rotates as the valve is opened and closed. The rotational angle of the magnet is detected by the electronic package 130.

Figure 7:
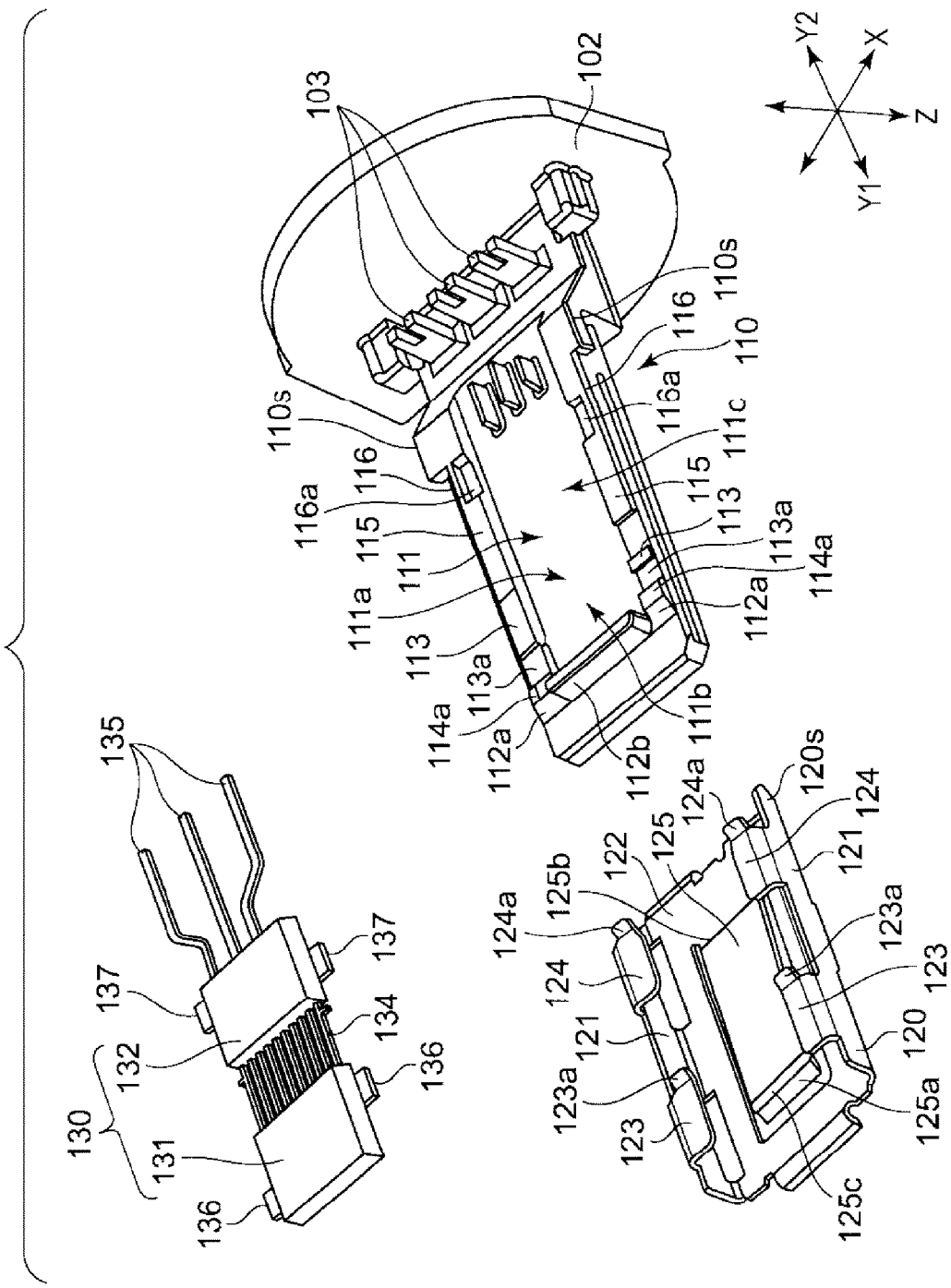
FIG. 7 is an exploded perspective view of the electronic device of FIG. 6 seen from the front side.

As illustrated in FIG. 7, the size of the support body 110 is larger in the Y direction which is the longitudinal direction than in the X direction which is the width direction.

A mount portion 111 is formed in a central portion in the X direction on a front side 110A of the support body 110. The mount portion 111 is a recess extending in the Y direction (Y1-Y2 direction). Preferably, the mount portion 111 has a first mount region 111b on the Y1 side and a second mount region 111c on the Y2 side. First rise portions 112a that rise in the Z direction and continue in the Y direction are formed on both sides in the X direction of the mount portion 111. A second rise portion 112b that rises in the Z direction and continues in the X direction is formed on the Y1 direction side of the mount portion 111.

Preferably, first projection receiving portions 113 are formed on the respective first rise portions 112a that face each other on the distal side (Y1 side) of the support body 110. These first projection receiving portions 113 are parallel to a bottom surface 111a of the mount portion 111 and, preferably, have respective receiving recesses 113a. These receiving recesses 113a are recessed from the first projection receiving portions 113 and open toward the mount portion 111.

Preferably, first regulating step portions 114a that rise in the Z direction are formed so as to be located further to the distal side (Y1 side) of the support body 110 than the respective first projection receiving portions 113. Inclined surfaces 115 are formed on upper surfaces of the respective first rise portions 112a. The inclined surfaces 115 are continuous with the first projection receiving portions 113 and inclined upward toward the base portion 102 side (Y2 side).

The first rise portions 112a that face each other preferably have respective second projection receiving portions 116 formed on upper surfaces thereof on the base portion 102 side (Y2 side). These second projection receiving portions 116 are parallel to the bottom surface 111a of the mount portion 111 and, preferably, have respective receiving recesses 116a. The receiving recesses 116a are recessed from the second projection receiving portions 116 and open toward the mount portion 111.

Figure 9:
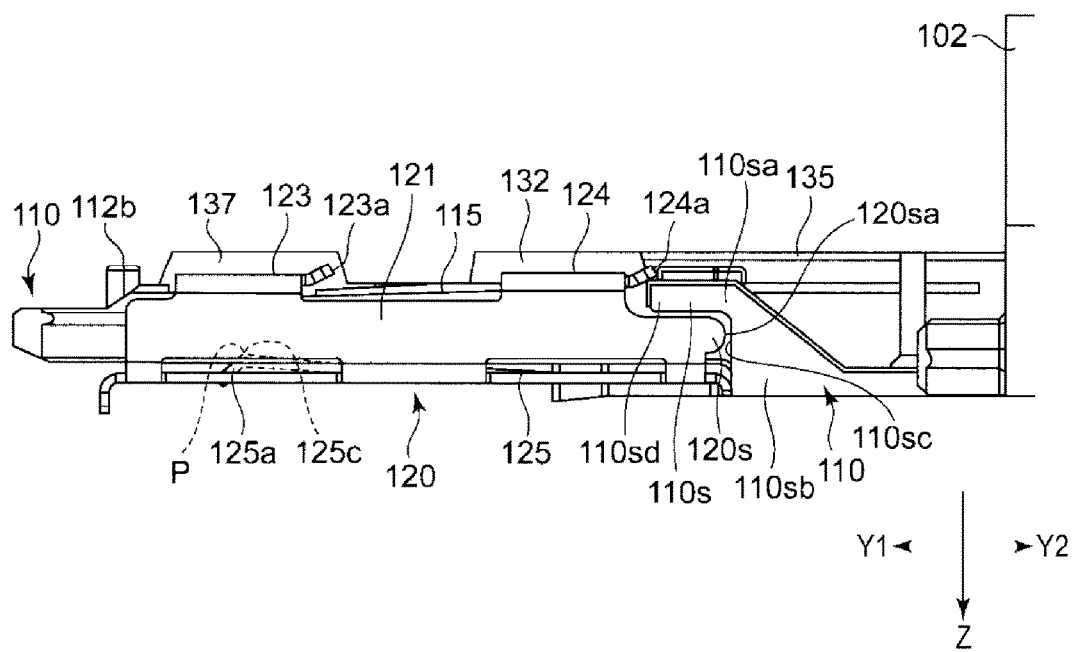
FIG. 9 is a side view of the electronic device of FIG. 6.

The second projection receiving portions 116 extend toward the base portion 102 side and are continuous with upper surfaces of second stopper portions 110s preferably provided on side surfaces of the support body 110 on both the sides in the X direction. The second stopper portions 110s are located on the Y2 side opposite to the first projection receiving portions 113 located on the Y1 side with the second projection receiving portions 116 interposed therebetween. As illustrated in FIG. 9, the second stopper portions 110s include pressing portions 110sa and bases 110sb. The pressing portions 110sa extend in the Y1-Y2 direction and have upper surfaces continuous with the second projection receiving portions 116. The bases 110sb extend downward in the Z direction from end portions of the pressing portions 110sa on the Y2 side. Reverse L-shaped spaces 110sc are formed below the pressing portions 110sa. The pressing portions 110sa have corner portions 110sd having curved surfaces on lower ends of distal end surfaces on the Y1 side.

Figure 8:
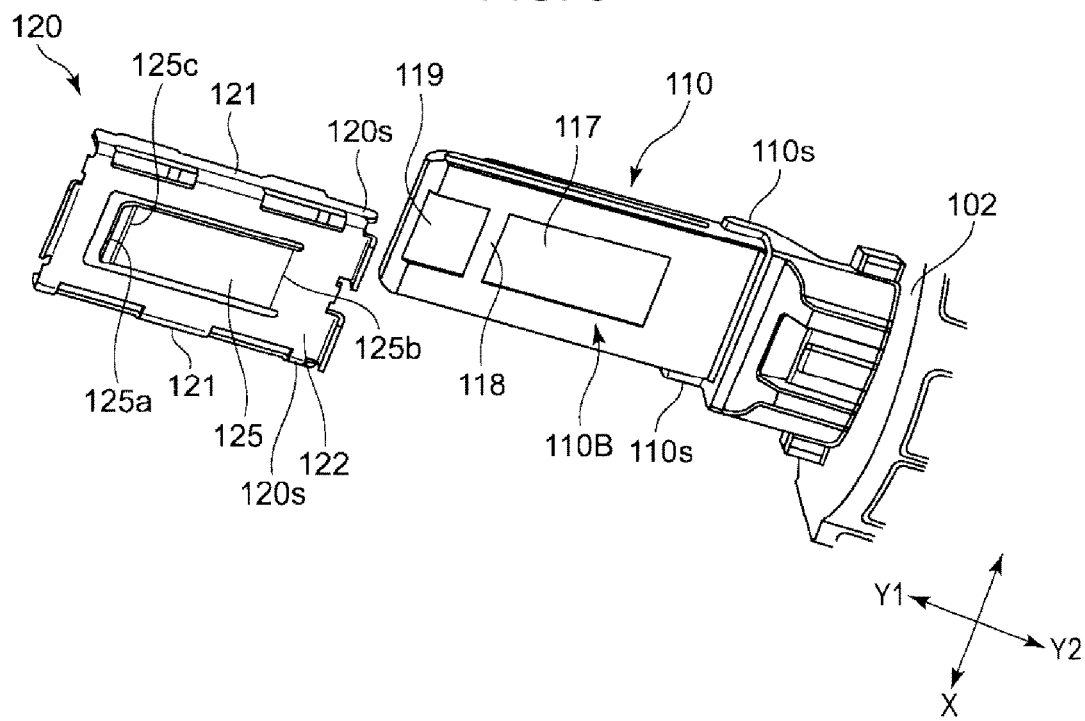
FIG. 8 is an exploded perspective view of the electronic device of FIG. 6 seen from the back side.

As illustrated in FIG. 8, an abutment portion 118 is formed on a rear side 110B of the support body 110. The abutment portion 118 is located further to the distal end side (Y1 side) than a central portion on the rear side 110B of the support body 110 in the longitudinal direction (Y direction).

Figure 10:
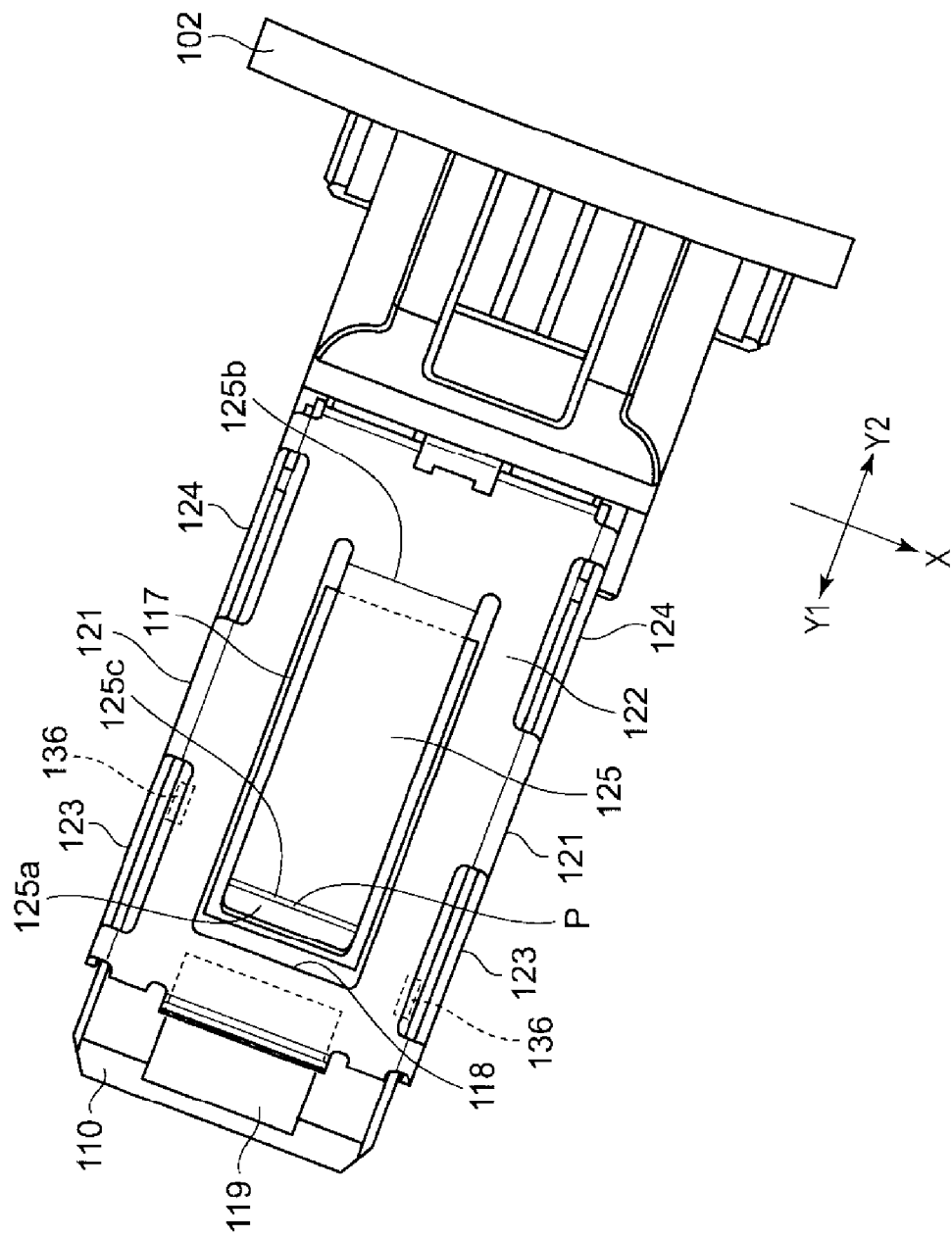
FIG. 10 is a bottom view of the electronic device of FIG. 6.

Also, a groove 117 is preferably formed so as to be located further to the base portion 102 side (Y2 side) of the support body 110 than the abutment portion 118. Also, the groove 119 open in the Y1 direction is preferably formed on the distal end side (Y1 side) of the support body 110. Preferably, these grooves 117 and 119 are recessed more than the abutment portion 118. As illustrated in FIG. 10, the abutment portion 118 is provided further to the Y1 side than a region corresponding to the center of the first mount region 111b in the longitudinal direction (Y direction). The region corresponding to the center of the first mount region 111b in the longitudinal direction (Y direction) is located on the upper side in the groove 117.

The clip member 120 is formed of an electrically conductive plate spring material such as a phosphor bronze plate. As illustrated in FIGS. 7 and 8, the clip member 120 includes side walls 121 and, preferably, a connecting portion 122. The side walls 121 are provided on both the side portions in the X direction so as to face each other. The connecting portion 122 connects the side walls 121 to each other.

Preferably, first pressing portions 123 are formed on the Y1 sides of upper end portions of the respective side walls 121, which face each other, of the clip member 120. Preferably, second pressing portions 124 are formed on the Y2 sides of the upper end portions of the respective side walls 121, which face each other, of the clip member 120. A pair of the first pressing portions 123 face the connecting portion 122 in the Z direction, and upwardly bent guide pieces 123a are formed on the Y2 sides of the first pressing portions 123. As is the case with the pair of the first pressing portions 123, a pair of the second pressing portions 124 serving as a holding portions face the connecting portion 122 in the Z direction, and upwardly bent guide pieces 124a are formed on the Y2 sides of the second pressing portions 124.

Preferably, an elastic piece 125 extending from Y2 side to the Y1 side is integrally formed with the connecting portion 122, which is a bottom portion of the clip member 120. A proximal portion 125b on the Y2 side of the elastic piece 125 is integrated with the connecting portion 122 of the clip member 120. A distal end portion 125a of the elastic piece 25 faces in the Y1 direction. The elastic piece 125 is bent upward from the proximal portion 125b. Furthermore, preferably, an elastic abutment portion 125c is provided. The elastic piece 125 is bent downward on the Y1 side from the elastic abutment portion 125c extending in the X direction. Thus, the elastic abutment portion 125c is located uppermost in the elastic piece 125. A portion of the elastic piece 125 further to the distal end side than this elastic abutment portion 125c is the distal end portion 125a.

Preferably as illustrated in FIGS. 8 and 9, first stopper portions 120s projecting in the Y2 direction are provided at end portions on the Y2 sides of the respective side walls 121 of the clip member 120. As illustrated in FIG. 9, outer surfaces 120sa on the Y2 sides of the first stopper portions 120s are curved portions projecting toward the Y2 sides. The first stopper portions 120s can be hooked on the second stopper portions 110s formed on the support body 110.

As illustrated in FIG. 7, connecting members 103 are attached to the base portion 102 side (Y2 side) of the support body 110. Upper portions of the connecting members 103 are bifurcated at distal ends thereof, and lower portions of the connecting members 103 are embedded in a proximal part on the base portion 102 side of the support body 110.

Preferably, as illustrated in FIGS. 6 and 7, the electronic package 130 includes a first main body portion 131 and a second main body portion 132. The first main body portion 131 and the second main body portion 132 are each configured in a similar manner to or in the same manner as a corresponding one of the first main body portion 31 and the second main body portion 32 according to the first embodiment. Preferably, a plurality of electrically conductive terminals 134 are provided. The electrically conductive terminals 134 that extend in the Y2 direction from the circuit unit in the first main body portion 131 pass through the inside of the second main body portion 132. Connecting terminals 135 extend from the second main body portion 132 toward the Y2 side. The electrically conductive terminals 134 are made by cutting an electrically conductive metal plate into pieces. Some of the cut pieces serve as both the electrically conductive terminals 134 and the connecting terminals 135.

Preferably, as illustrated in FIG. 7, first metal projections 136 project from respective side portions of the first main body portion 131 that face in the X direction, and second metal projections 137 project from respective side portions of the second main body portion 132 that face in the X direction. The first metal projections 136 and the second metal projections 137 are integrally formed with the corresponding electrically conductive terminals 134 located in the first main body portion 131 and the second main body portion 132. The first metal projections 136 and the second metal projections 137 are preferably set to, for example, a ground potential.

Next, a method of assembling (method of producing) the electronic device 101 is described.

The first main body portion 131 and the second main body portion 132 of the electronic package 130 are mounted on the recessed mount portion 111 of the support body 110. Preferably, the first main body portion 131 is disposed in the first mount region 111b of the mount portion 111 and the second main body portion 132 is disposed in the second mount region 111c of the mount portion 111. That is, in the mount portion 111, the first mount region 111b is a region where the first main body portion 131 is disposed, and the second mount region 111c is a region where the second main body portion 132 is disposed. Preferably, the two first metal projections 136 projecting from the first main body portion 131 are each caused to enter a corresponding one of the two receiving recesses 113a formed in the first projection receiving portions 113 of the support body 110, and, preferably, the two second metal projections 137 projecting from the second main body portion 132 are each caused to enter a corresponding one of the two receiving recesses 116a formed in the second projection receiving portions 116 of the support body 110.

When the first metal projections 136 projecting from both the sides in the X direction each enter the corresponding one of the two receiving recesses 113a and the second metal projections 137 projecting from both the sides in the X direction similarly to the first metal projections 136 each enter the corresponding one of the two receiving recesses 116a, the electronic package 130 is positioned so that the electronic package 130 is not largely moved in the X or Y direction on the support body 110. Here, as is the case with the metal projections 36 and 37 according to the first embodiment, upper surfaces of the first metal projections 136 disposed in the receiving recesses 113a slightly project upward in the Z direction from the first projection receiving portions 113, and upper surfaces of the second metal projections 137 slightly project upward in the Z direction from the second projection receiving portions 116.

Next, the clip member 120 is mounted. The clip member 120 is mounted in the Y2 direction and removed in the Y1 direction.

After the electronic package 130 has been mounted on the support body 110, the clip member 120 is mounted in the Y2 direction. Preferably, the clip member 120 is mounted in the Y2 direction such that the connecting portion 122 faces the rear side 110B of the support body 110 and the first pressing portions 123 and the second pressing portions 124 face the front side 110A of the support body 110. At this time, the second pressing portions 124 are moved on the first regulating step portions 114a, the first projection receiving portions 113, and the inclined surfaces 115 in the Y2 direction, and after that, the first pressing portions 123 are moved on the first regulating step portions 114a in the Y2 direction.

As illustrated in FIG. 8, the groove 119 open toward the Y1 side is formed on the rear side 110B of the support body 110. Thus, the elastic piece 125 provided in the connecting portion 122 of the clip member 120 preferably passes through the groove 119 for a while from the start of the mounting work of the clip member 120. This prevents the elastic piece 125 from being strongly elastically pressed against the rear side 110B of the support body 110, thereby reducing resistance during the mounting of the clip member 120 in the Y2 direction.

When the clip member 120 is further moved in the Y2 direction, the first pressing portions 123 are moved to positions where the first pressing portions 123 can press the first metal projections 136 from above, and the second pressing portions 124 are moved to positions where the second pressing portions 124 can press or face the second metal projections 137 from above. At this time, the elastic abutment portion 125c of the elastic piece 125 that has so far been passing through the groove 119 on the rear side 110B of the support body 110 is preferably moved beyond the abutment portion 118 and elastically abuts the groove 117 on the rear side 110B of the support body 110. At this time, preferably, the first pressing portions 123 press the first metal projections 136 in the receiving recesses 113a against the first projection receiving portions 113 and the second pressing portions 124 press the second metal projections 137 in the receiving recesses 116a against the second projection receiving portions 116 or hold the second metal projections 137 in the receiving recesses 116a. Preferably, at this time, as illustrated in FIG. 10, the elastic abutment portion 125c of the elastic piece 125 elastically abuts the inside of the groove 117 below the first mount region 111b of the mount portion 111. More preferably, an elastic abutment position P of the elastic abutment portion 125c at this time is set at the center in the Y direction of the region corresponding to the first mount region 111b in the groove 117 on the rear side 110B of the support body 110. Preferably, a position where the elastic abutment portion 125c elastically abuts the position P on the rear side 110B of the support body 110 corresponds to the pair of first metal projections 136 each projecting in the X direction from a corresponding one of the sides of the first main body portion 131, and more preferably, corresponds to a midpoint position of the first metal projections 136 in the Y direction.

Furthermore, when the clip member 120 is moved in the Y2 direction, the first pressing portions 123 are moved to the positions where the first pressing portions 123 can press the first metal projections 136 from above and the second pressing portions 124 are moved to the positions where the second pressing portions 124 can press or hold the second metal projections 137 from above, as illustrated in FIG. 9, the first stopper portions 120s provided in the clip member 120 enter the spaces 110sc below the pressing portions 110sa of the second stopper portions 110s formed on both the side surfaces of the support body 110. Since the elastic abutment portion 125c of the elastic piece 125 is elastically pressed against the rear side 110B of the support body 110 at the elastic abutment position P, an urging force acts on the clip member 120 so as to rotate the clip member 120 counterclockwise in FIG. 9 about the elastic abutment position P acting as the fulcrum. This urging force causes upper surfaces of the first stopper portions 120s to abut lower surfaces of the pressing portions 110sa of the second stopper portions 110s. Thus, the counterclockwise rotation of the clip member 120 can be regulated.

Since the counterclockwise rotation of the clip member 120 can be regulated, the urging force applied from the elastic abutment portion 125c to the support body 110 by the elastic force of the elastic piece 125 can be prevented from being reduced. As a result, a force with which the first pressing portions 123 press the first metal projections 136 and the force with which the second pressing portions 124 press the second metal projections 137 are not reduced. Furthermore, play of the clip member 120 with the support body 110 can be eliminated.

Furthermore, the corner portions 110sd on the Y1 sides of the pressing portions 110sa provided in the support body 110 are curved, and the outer surfaces 120sa on the Y2 sides of the first stopper portions 120s provided in the clip member 120 are also curved. Thus, when mounting the clip member 120 in the Y2 direction, the curved portions of the pressing portions 110sa and the curved portions of the first stopper portions 120s slide against one another. This allows the first stopper portions 120s to smoothly enter the spaces below the pressing portions 110sa.

As is the case with the first embodiment, when the first metal projections 136 and the second metal projections 137 are positioned and clamped on the upper surfaces of the first rise portions 112a of the support body 110, the gap δ (see FIG. 5) is preferably formed between the bottom surface 111a of the mount portion 111 of the support body 110 and lower surfaces of the first main body portion 131 and the second main body portion 132. Also as is the case with the first embodiment, after the electronic package 130 has been mounted on the support body 110, the connecting terminals 135 of the electronic package 130 are disposed on the connecting members 103 provided in the proximal part on the base portion 102 side of the support body 110, and the connecting terminals 135 and the connecting members 103 are connected to one another by spot welding or soldering.

The clip member 120 having been mounted can be prevented from being removed in the Y1 direction by elastic abutment of the distal end portion 125a of the elastic piece 125 against the rear surface 110B of the support body 110 and contact of the first stopper portions 120s and the second stopper portions 110s with one another. Furthermore, when the clip member 120 is moved in the removing direction (Y1 direction) in the case where, for example, the electronic device 101 is subjected to an impact, the distal end portion 125a is engaged with the abutment portion 118. This can prevent the clip member 120 from being removed.

In the electronic device 101 according to the second embodiment, the first stopper portions 120s are provided in the clip member 120 and the second stopper portions 110s are provided in the support body 110. With this configuration, the first stopper portions 120s are caused to enter the spaces 110sc of the second stopper portions 110s when assembling. Thus, the rotation of the clip member 120 is suppressed. However, as long as the rotation can be suppressed, the stopper portions may be provided in only one of the support body 110 or the clip member 120. Furthermore, the configuration in which the stopper portions are provided in both the support body 110 and the clip member 120 is not limited to the configuration as in the second embodiment.

With the electronic device 1 according to the first embodiment, the force of the elastic piece 25 is equally applied to the two sets of the metal projections 36 and 37, that is, four metal projections. Thus, the elastic piece 25 is in contact with the support body 10 at a point of application at a substantially central position of these four metal projections on in an XY plane. With this structure, however, in order to increase the elastic abutment force against the support body 10 while suppressing the value of stress produced in the proximal portion of the elastic piece 25 to a spring deflection limit or smaller, it is required that the distance between the proximal portion of the elastic piece 25 to the point of application be increased. Thus, it is required that the size of the elastic piece 25, and further, the size of the clip member 20 be increased in the Y1-Y2 direction.

In contrast, with the electronic device 101 according to the second embodiment, the position of the elastic abutment portion 125c where the elastic piece 125 elastically abuts the support body 110 is the midpoint position of a set of the first metal projections 136 of the first main body portion 131. This allows the distance between the proximal portion 125b and the elastic abutment portion 125c to be increased. Accordingly, the increase in the value of stress produced in the proximal portion 125b can be suppressed when the elastic abutment force against the support body 110 is increased. Thus, the elastic abutment force against the support body 110 can be increased and damage to the elastic piece 125 due to stress can be prevented without increasing the size of the clip member 120 in the Y1-Y2 direction.

Furthermore, when the electronic package 130 is configured such that some type of a detecting element is encapsulated in the first main body portion 131 and circuitry and elements associated to the detecting element are encapsulated in the second main body portion 132, positional accuracy required for disposition of the first main body portion 131 is higher than that required for disposition of the second main body portion 132. The reason for this is that misalignment of the position where the first main body portion 131 is disposed leads to detection errors performed by the detecting element. When the configuration according to the second embodiment is applied to the electronic package 130 configured as described above, the elastic abutment position P of the elastic abutment portion 125c becomes a position corresponding to the first main body portion 131 for which a higher positional accuracy is required. Thus, the holding force is more directly applied by the first main body portion 131 than that with the configuration according to the first embodiment. Accordingly, the likelihood of the first main body portion 131 being misaligned is reduced. This can prevent damage to the elastic piece 125 without degrading detection accuracy of the electronic package 130 (electronic device 101).

Other operations, effects and variants of the second embodiment are the same as or similar to those of the first embodiment.

In should be understood that, although the present invention has been described with reference to the above-described embodiments, the present invention is not limited to the above-described embodiments and can be improved or modified without departing from purposes of improvement or the gist of the present invention.

What is claimed is:

1. An electronic device comprising:
an electronic package; and
a support body that supports the electronic package,
wherein a main body having side surfaces that face each other and metal projections that project from the respective side surfaces are provided in the electronic package,
wherein a mount portion on which the main body is mounted and projection receiving portions that receive the respective metal projections are disposed in the support body,
wherein the metal projections and the support body are clamped by a clip member that comprises an elastic metal plate,
wherein the main body of the electronic package includes a first main body portion and a second main body portion,
wherein the side surfaces include side surfaces of the first main body portion that face each other and side surfaces of the second main body portion that face each other,
wherein the electronic package includes a wiring member that connects the first main body portion and the second main body portion to each other,
wherein the metal projections include metal projections provided in the first main body portion and metal projections provided in the second main body portion, the metal projections of the first main body portion project from the respective side surfaces of the first main body portion, and the metal projections of the second main body portion project from the respective side surfaces of the second main body portion,
wherein the mount portion of the support body includes a first mount region on which the first main body portion is mounted and a second mount region on which the second main body portion is mounted,
wherein the projection receiving portions include first projection receiving portions formed in the support body and second projection receiving portions formed in the support body,
wherein the first projection receiving portions receive the respective metal projections provided in the first main body portion, and the second projection receiving portions receive the respective metal projections provided in the second main body portion,
wherein first pressing portions, second pressing portions, and a connecting portion are provided in the clip member, and
wherein the first pressing portions press the respective metal projections of the first main body portion against the first projection receiving portions, the second pressing portions press the respective metal projections of the second main body portion against the second projection receiving portions, and the connecting portion connects the first pressing portions to each other and the second pressing portions to each other.

2. The electronic device according to claim 1,
wherein a gap is formed between the main body of the electronic package and the mount portion.

3. The electronic device according to claim 1,
wherein receiving recesses are formed in the projection receiving portions of the support body, the metal projections are disposed in the receiving recesses, and the metal projections in the receiving recesses are pressed against the projection receiving portions by the clip member.

4. The electronic device according to claim 2,
wherein receiving recesses are formed in the projection receiving portions of the support body, the metal projections are disposed in the receiving recesses, and the metal projections in the receiving recesses are pressed against the projection receiving portions by the clip member.

5. The electronic device according to claim 1,
wherein a pair of pressing portions that respectively press one of the metal projections provided on one side portion of the main body and another metal projection provided on another side portion of the main body against the support body are provided in the clip member, and a connecting portion that connects the pair of pressing portions to each other is provided in the clip member,
wherein the pressing portions face a front side of the support body and the connecting portion faces a rear side of the support body, and
wherein an elastic piece elastically pressed against the rear side of the support body is provided in the connecting portion.

6. The electronic device according to claim 5,
wherein the clip member is at an identical potential to potentials of the metal projections so as to function as a shield member.

7. The electronic device according to claim 1,
wherein the first pressing portions and the second pressing portions face a front side of the support body, the connecting portion faces a rear side of the support body, and an elastic piece elastically pressed against the rear side of the support body is provided in the connecting portion, and
wherein the elastic piece extends from a proximal portion located at a leading side in a mounting direction in which the clip member is mounted to the support body toward a trailing side in the mounting direction, an elastic abutment portion that elastically abuts the rear side of the support body is provided at an end portion on the trailing side of the elastic piece, and the elastic abutment portion elastically abuts the rear side at a position corresponding to the first mount region.

8. The electronic device according to claim 7,
wherein the elastic abutment portion elastically abuts the rear side at a position corresponding to the metal projections provided in the first main body portion.

9. The electronic device according to claim 7,
wherein a stopper is provided so as to regulate an urging force that acts on the clip member on the leading side in the mounting direction of the clip member between the clip member and the support body with an elastic abutment position where the elastic abutment portion and the support body are in elastic abutment with each other acting as a fulcrum.

10. The electronic device according to claim 8,
wherein a stopper is provided so as to regulate an urging force that acts on the clip member on the leading side in the mounting direction of the clip member between the clip member and the support body with an elastic abutment position where the elastic abutment portion and the support body are in elastic abutment with each other acting as a fulcrum.

11. The electronic device according to claim 9,
wherein the stopper includes a first stopper portion provided in the clip member and the second stopper portion provided in the support body, and wherein the first stopper portion abuts the second stopper portion on a side where the urging force is regulated when the clip member is mounted to the support body.

12. The electronic device according to claim 10,
wherein the stopper includes a first stopper portion provided in the clip member and the second stopper portion provided in the support body, and
wherein the first stopper portion abuts the second stopper portion on a side where the urging force is regulated when the clip member is mounted to the support body.

13. A method of producing an electronic device in which an electronic package is secured to a support body, the method comprising the steps of:
providing in the electronic package a main body having side surfaces facing each other and metal projections that project from the respective side surfaces of the main body, wherein: the main body of the electronic package includes a first main body portion and a second main body portion; the side surfaces include side surfaces of the first main body portion that face each other and side surfaces of the second main body portion that face each other; and the metal projections include metal projections provided in the first main body portion and metal projections provided in the second main body portion, the metal projections of the first main body portion project from the respective side surfaces of the first main body portion, and the metal projections of the second main body portion project from the respective side surfaces of the second main body portion;
providing in the electronic package a wiring member that connects the first main body portion and the second main body portion to each other;
forming in the support body a mount portion on which the main body is mounted and projection receiving portions that receive the respective metal projections, wherein: the mount portion of the support body includes a first mount region on which the first main body portion is mounted and a second mount region on which the second main body portion is mounted; the projection receiving portions include first projection receiving portions formed in the support body and second projection receiving portions formed in the support body; and the first projection receiving portions receive the respective metal projections provided in the first main body portion, and the second projection receiving portions receive the respective metal projections provided in the second main body portion;
forming a pressing portion and an elastic piece located on sides that face each other in a clip member formed of an elastic metal plate wherein first pressing portions, second pressing portions, and a connecting portion are provided in the clip member;
mounting the clip member to the support body in a direction perpendicular to a direction in which the pressing portion and the elastic piece face each other; and
elastically pressing the elastic piece against a rear side of the support body so as to cause the pressing portion to press the metal projections against the projection receiving portions wherein the first pressing portions press the respective metal projections of the first main body portion against the first projection receiving portions, the second pressing portions press the respective metal projections of the second main body portion against the second projection receiving portions, and the connecting portion connects the first pressing portions to each other and the second pressing portions to each other.

14. The method according to claim 13, further comprising:
forming a regulating step portion in the support body; and
hooking on the regulating step portion the clip member mounted at a position where the clip member clamps the metal projections and the support body, thereby preventing the clip member from being removed.

15. The method according to claim 13, further comprising:
forming an abutment portion and a groove recessed more than the abutment portion on the rear side of the support body,
wherein, during the mounting of the clip member to the support body, the elastic piece is caused to pass through the groove, and
wherein, when the clip member is mounted at a position where the clip member clamps the metal projections and the support body, the elastic piece is caused to move onto the abutment portion to elastically press the abutment portion.

\* \* \* \* \*